(12) United States Patent
Chen

(10) Patent No.: US 6,373,704 B1
(45) Date of Patent: Apr. 16, 2002

(54) CLIP FOR HEAT DISSIPATION DEVICE

(75) Inventor: Chun-Chi Chen, Taipei (TW)

(73) Assignee: Foxconn Precision Ind. Co., Ltd., Taipei Hsieh (TW)

( * ) Notice: Subject to any disclaimer, the term of this patent is extended or adjusted under 35 U.S.C. 154(b) by 0 days.

(21) Appl. No.: 09/863,963

(22) Filed: May 23, 2001

(51) Int. Cl.[7] ................................................ H05K 7/20
(52) U.S. Cl. ...................... 361/704; 174/16.3; 165/80.3; 257/718; 257/719; 257/727
(58) Field of Search ................................. 361/704, 707, 361/709–712, 717–719; 174/16.3; 165/80.3, 185; 257/706, 707, 718, 719, 727; 248/505, 510; 24/295, 625, 455–458

(56) References Cited

U.S. PATENT DOCUMENTS 5,710,694 A * 1/1998 Chen ........................... 361/703
6,266,245 B1 * 7/2001 Wei ............................. 361/704

* cited by examiner

Primary Examiner—Leo P. Picard
Assistant Examiner—Boris L. Chervinsky
(74) Attorney, Agent, or Firm—Wei Te Chung

(57) ABSTRACT

A clip (20) for securing a heat dissipation device (40) to a CPU (50) includes a body (210) and a bolt (230). The body includes a central pressing portion (214), and a pair of first and second latching portions (211, 213) for engaging with a socket (60). The second latching portion forms a spring portion (215) extending outwardly from a central section thereof. The spring portion defines a through hole (217) with screw threads. The bolt is inserted into the through hole so that a height of the second latching portion can be resiliently adjusted by changing the extent of insertion of the bolt.

16 Claims, 5 Drawing Sheets

CLIP FOR HEAT DISSIPATION DEVICE

BACKGROUND OF THE INVENTION

1. Field of the Invention

The present invention relates to securing of heat dissipation devices, and particularly to a clip which is adjustable to ensure that a heat dissipation device can be securely attached to a heat-generating electronic device.

2. Description of Related Art

A computer central processing unit (CPU) is the core administrator of electrical signals in many contemporary computers. Continued development of CPUs has enabled them to perform more and more functions. Correspondingly, heat generated by CPUs is constantly increasing. This can adversely affect the operational stability of computers. Measures must be taken to efficiently remove the heat from the CPU. Typically, a heat dissipation device having great heat conductivity is mounted on the CPU to remove heat therefrom. A clip is frequently used to facilitate firm attachment of the heat dissipation device to the CPU, thus achieving greater efficiency of heat dissipation.

A conventional clip is shown in FIG. 5. The clip 10 comprises a central horizontal pressing portion 109, a pair of opposite spring arms 102 extending upwardly from the pressing portion 109, and a pair of latching portions 103 respectively depending from the spring arms 102. Each latching portion 103 has an operating element 106 extending upwardly therefrom, and defines an opening 105 below the operating element 106. The operating elements 106 facilitate engagement of the openings 105 with corresponding catches, to thereby secure the heat dissipation device to a CPU.

Unfortunately, manual pulling of the operating elements 106 of the latching portions 103 easily hurts an operator's hands. Furthermore, long-term use under conditions of normal levels of vibration tends to cause the clip 10 to deform. This lessens the tension of the clip 10, and frequently results in the heat dissipation device moving relative to the CPU. Another disadvantage is that the clip 10 must be manufactured to unduly precise dimensions, to ensure that the clip 10 can attain the requisite tension. Even if there is little departure from the narrow tolerances, the clip 10 cannot properly secure the heat dissipation device to the CPU.

Thus, an adjustable clip which can overcome the above-mentioned problems is strongly desired.

SUMMARY OF THE INVENTION

Accordingly, an object of the present invention is to provide a clip which is adjustable to ensure that a heat dissipation device can be safely, securely and reliably attached to an electronic device.

Another object of the present invention is to provide a clip which is easy and cost-efficient to manufacture.

In order to achieve the objects set out above, a clip of the present invention comprises a body and a bolt. The body comprises a central pressing portion for pressing a heat dissipation device onto a CPU, a pair of first and second spring arms extending upwardly from the pressing portion, and a pair of first and second latching portions for engaging with a socket. The second latching portion forms a spring portion extending outwardly from a central section thereof. The spring portion defines a through hole with screw threads. The bolt is inserted into the through hole so that a height of the second latching portion can be resiliently adjusted by changing the extent of insertion of the bolt. Thus, the heat dissipation device can be securely attached to the CPU.

Other objects, advantages and novel features of the present invention will become more apparent from the following detailed description when taken in conjunction with the accompanying drawings.

DETAILED DESCRIPTION OF THE INVENTION

Figure 1:
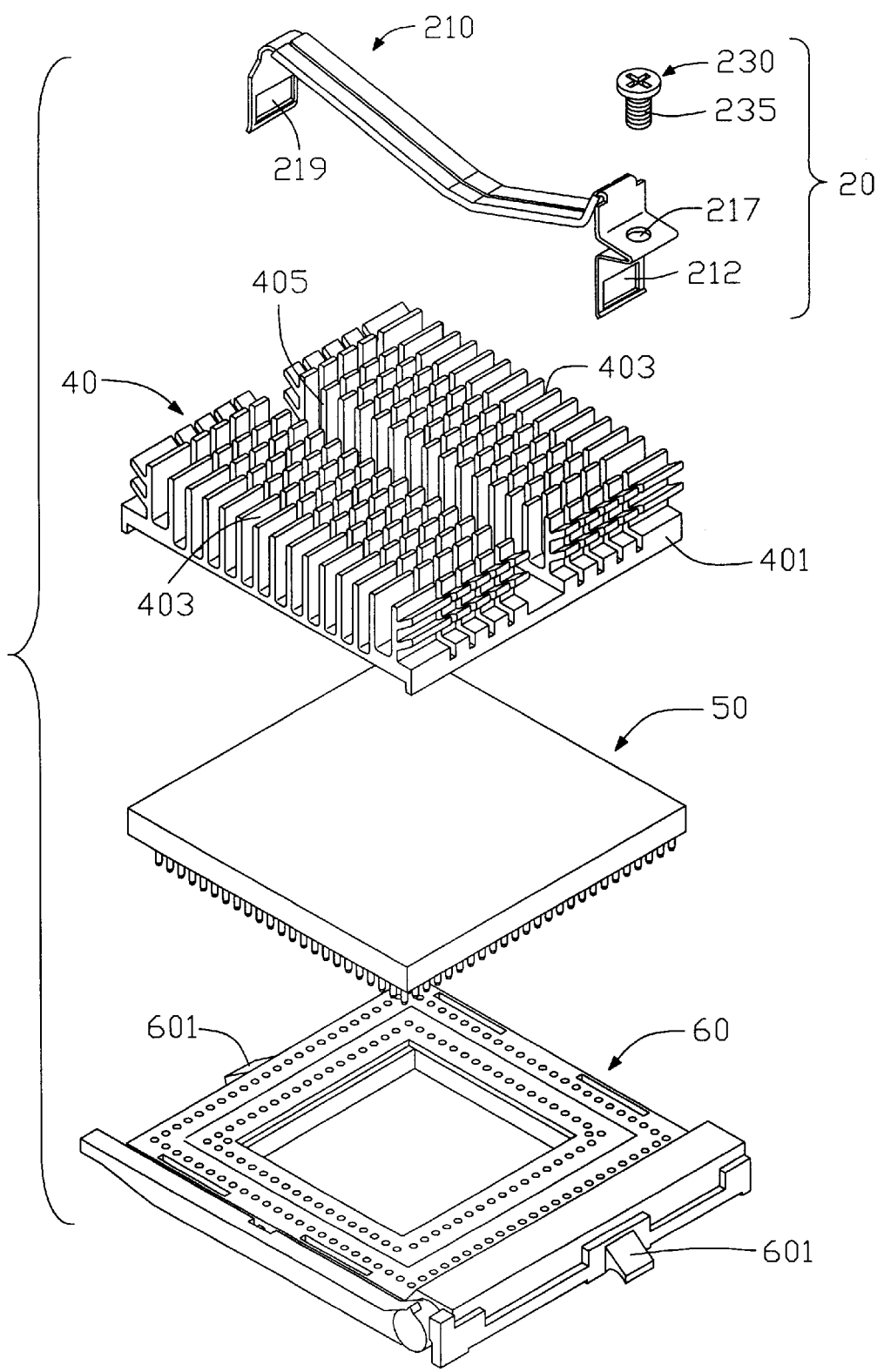
FIG. 1 is an exploded view of a clip in accordance with the present invention for securing a heat dissipation device to a central processing unit mounted on a socket.

Reference will now be made to the drawing figures to describe the present invention in detail.

Referring to FIG. 1, a clip 20 of the present invention comprises a body 210 and a bolt 230. The clip 20 secures a heat dissipation device 40 to a CPU 50 mounted on a socket 60. The heat dissipation device 40 comprises a chassis 401, and a plurality of fins 403 extending upwardly from the chassis 401. A receiving channel 405 is defined through the fins 403, for receiving the clip 20 therein. The socket 60 has a pair of catches 601 at opposite sides thereof, for engaging with the clip 20.

Figure 2:
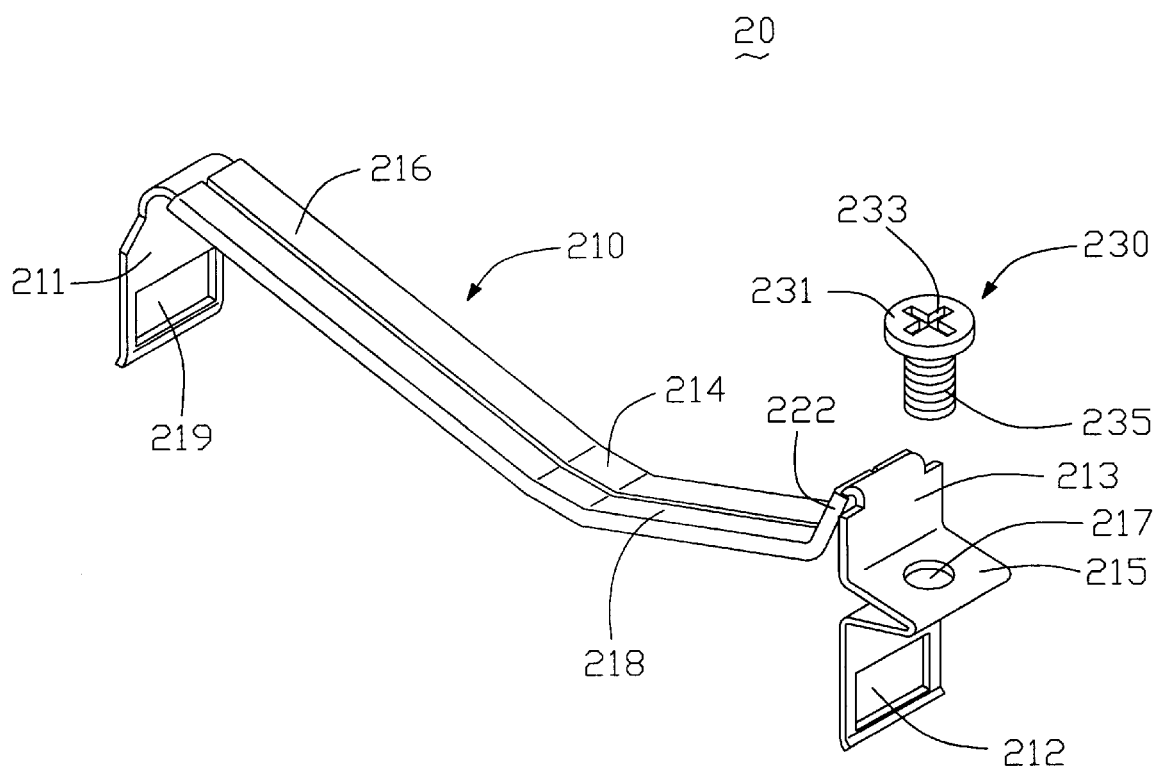
FIG. 2 is a perspective view of the clip of FIG. 1.
Figure 3:
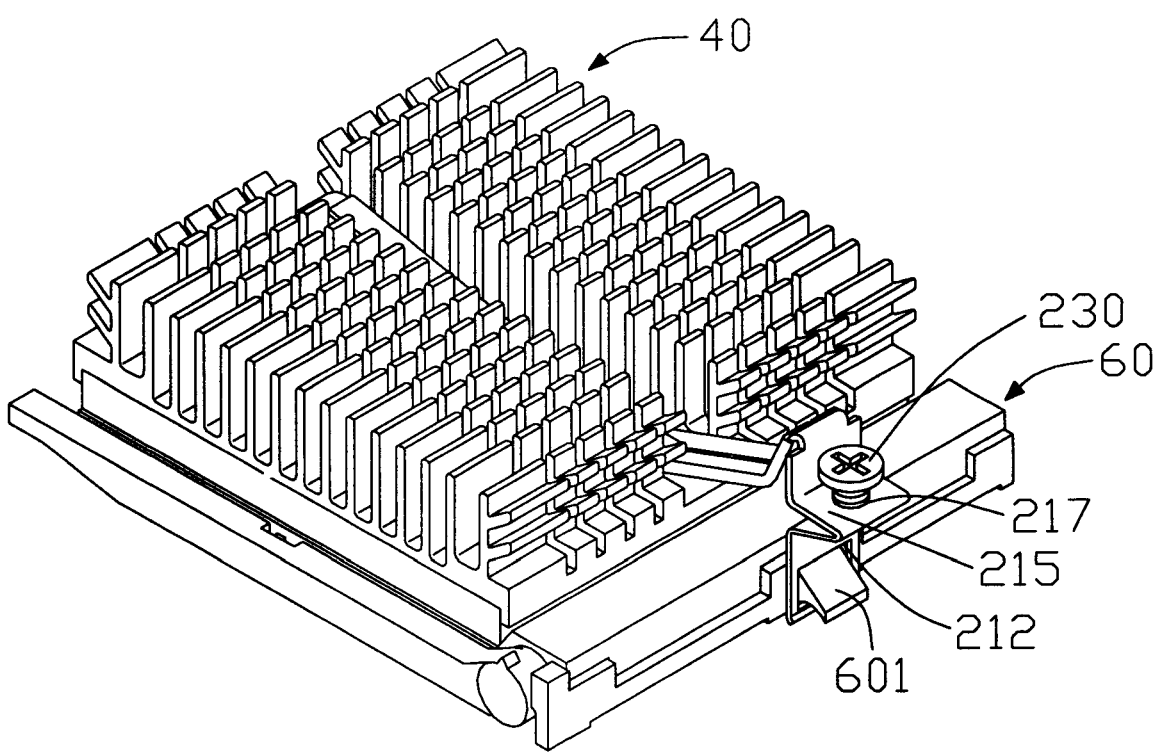
FIG. 3 is a partly-assembled view of FIG. 1.
Figure 4:
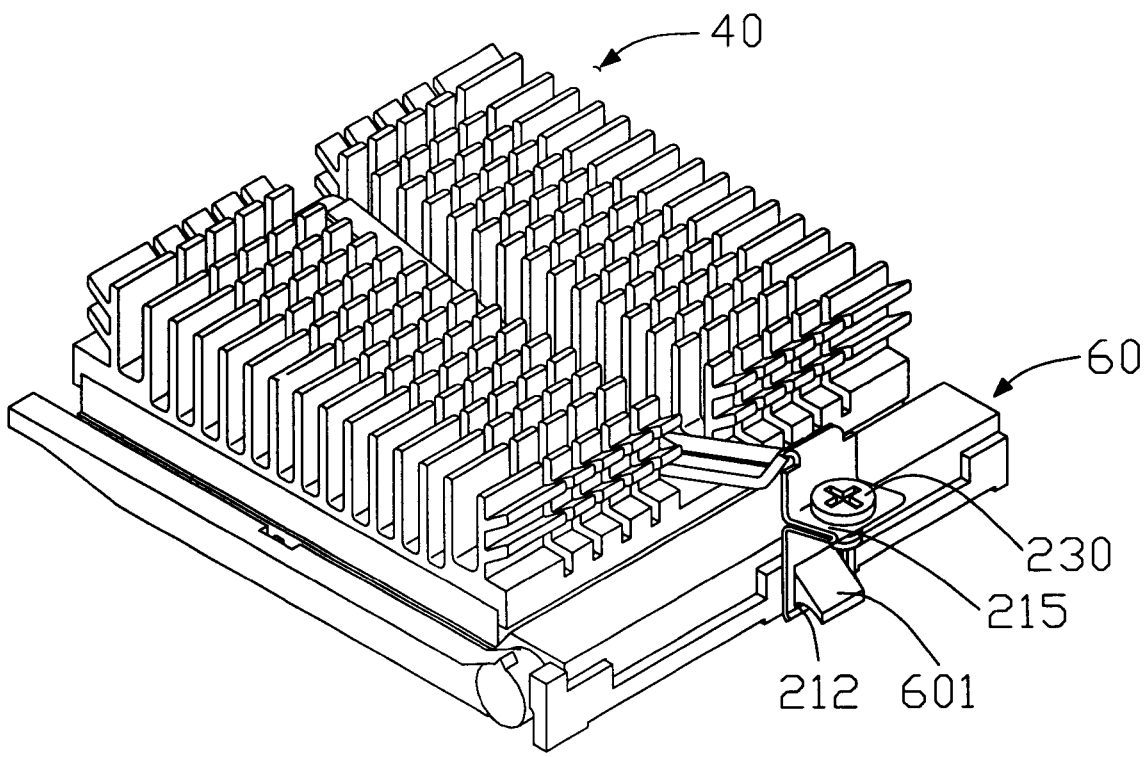
FIG. 4 is a fully assembled view of FIG. 1.
Figure 5:
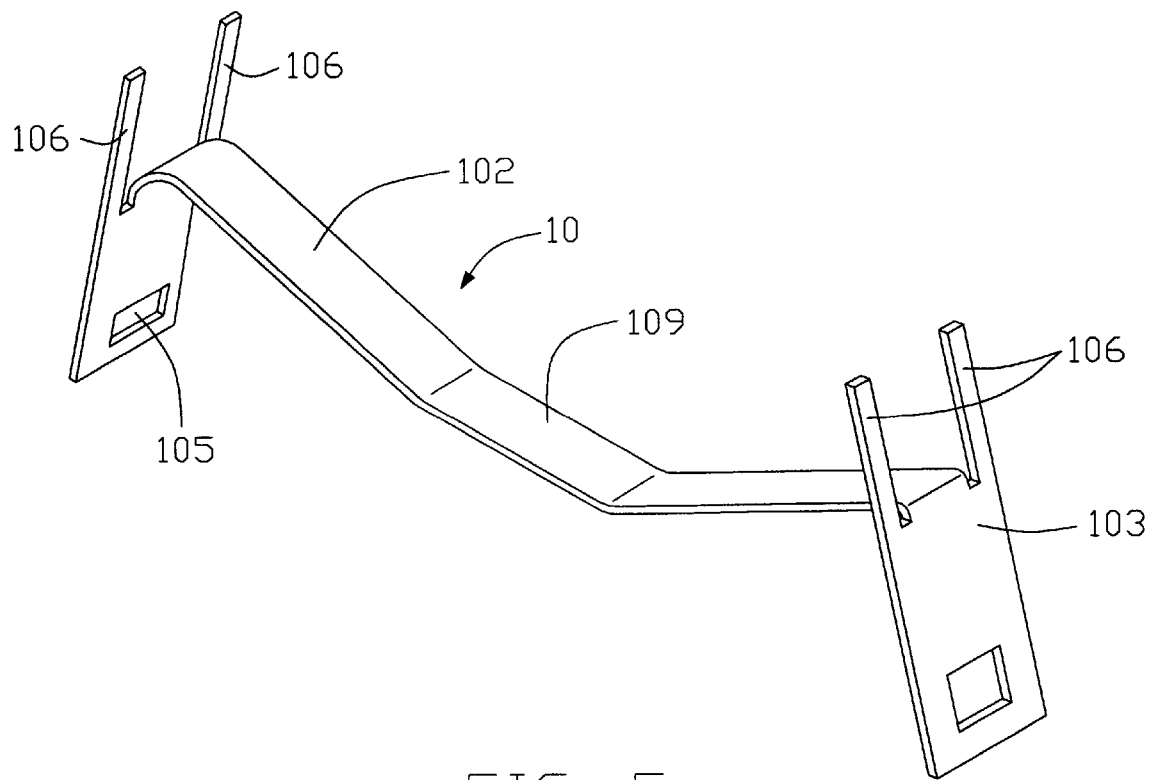
FIG. 5 is a perspective view of a conventional clip.

Referring particularly to FIG. 2, the body 210 of the clip 20 has a central pressing portion 214, for pressing the heat dissipation device 40 onto the CPU 50. A first spring arm 216 extends outwardly and upwardly from an end of the pressing portion 214. A first latching portion 211 depends from a free end of the first spring arm 216. A first opening 219 is defined in a lower portion of the first latching portion 211, for receiving one catch 601 of the socket 60.

A second spring arm 218 extends outwardly and upwardly from an opposite end of the pressing portion 214. The second spring arm 218 further extends upwardly and outwardly to form a connecting portion 222 which is steeper than both the first and second spring arms 216, 218. A second latching portion 213 depends from a free end of the connecting portion 222. A V-shaped spring portion 215 extends outwardly from a central section of the second latching portion 213, so that a height of the second latching portion 213 is variable. The spring portion 215 defines a through hole 217 with mutual screw threads. A second opening 212 is defined in the second latching portion 213 below the spring portion 215, for receiving another catch 601 of the socket 60. Reinforcing flanges (not labeled) are respectively bent inwardly and downwardly from edges of the pressing portion 214, the first and second spring arms 216, 218 and the connecting portion 222 of the body 210.

The bolt 230 comprises a head 231, and a post 235 depending from the head 231. A cross-slot 233 is defined in a top surface of the head 231, for facilitating operation of the bolt 230. The post 235 has a diameter less than that of the head 231, and forms a screw thread on an outer surface thereof for mating with the spring portion 215 in the through hole 217.

Referring to FIGS. 1 to 4, in assembly, the CPU 50 is mounted on the socket 60. The heat dissipation device 40 is attached on a top surface of the CPU 50. The receiving channel 405 of the heat dissipation device 40 spans between the catches 601 of the socket 60. The clip 20 is received in the receiving channel 405, with the first and second openings 219, 212 loosely receiving the catches 601 of the socket 60. The bolt 230 is inserted into the through hole 217 of the second latching portion 213 using a tool (not shown), so that the first and second openings 219, 212 securely receive the catches 601 of the socket 60. The extent of insertion of the bolt 230 is adjusted according to the dimensions of the socket 60 and the heat dissipation device 50. Thus, the height of the second latching portion 213 is resiliently adjusted such that the clip 20 fly but safely engages with the socket 60. As a result, the heat dissipation device 50 is optimally secured on the top surface of the CPU 50 for efficiently removing heat therefrom.

In disassembly, the bolt 230 is removed from the through hole 217, whereupon the second latching portion 213 resiliently deforms back to its original position. Thus, the first and second openings 219, 215 loosely accommodate the catches 601 of the socket 60. The clip 20 is then easily removed.

The clip 20 of the present invention has a spring portion 215 at the second latching portion 213. The spring portion 215 is engaged with the bolt 230 to resiliently adjust the height of the second latching portion 213. Therefore, the clip 20 can engage with a variety of heat dissipation devices and sockets. Furthermore, resiliently adjusting the height of the second latching portion 213 allows the clip 20 to remain correctly in position over a long period of time, even when the system is subjected to vibration or shock during normal operation.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the fall extent indicated by the broad general meaning of the terms in which the appended claims are expressed.

What is claimed is:

1. A clip for engaging with a heat dissipation device and a socket supporting a CPU thereon, the clip comprising:
   a body comprising a pressing portion for pressing the heat dissipation device onto the CPU, first and second spring arms extending upwardly from the pressing portion, and first and second latching portions for engaging with the socket, the second latching portion forming a spring portion extending outwardly from a central section thereof, the spring portion defining a through hole therein; and
   a bolt inserted into the through hole of the spring portion so that a height of the second latching portion can be adjusted by changing the extent of insertion of the bolt.

2. The clip as described in claim 1, wherein the spring portion is generally V-shaped.

3. The clip as described in claim 1, wherein the spring portion has mutual screw threads at the through hole.

4. The clip as described in claim 1, wherein a connecting portion is formed between the second spring arm and the second latching portion.

5. The clip as described in claim 4, wherein the first latching portion depends from the first spring arm, and wherein the second latching portion depends from the connecting portion.

6. The clip as described in claim 4, wherein the connecting portion is steeper than the second spring arm.

7. The clip as described in claim 4, wherein flanges are bent from edges of the pressing portion, the first and second spring arms and the connecting portion, for reinforcing the body.

8. The clip as described in claim 1, wherein the bolt comprises a head and a post.

9. The clip as described in claim 8, wherein the head defines a cross-slot in a top surface thereof, for facilitating operation of the bolt.

10. The clip as described in claim 8, wherein the post has a diameter less than that of the head.

11. The clip as described in claim 8, wherein the post forms a screw thread thereon engaging with the spring portion in the through hole.

12. A clip for securing a heat dissipation device, comprising:
    a body comprising
        a pressing portion;
        first and second spring arms extending outwardly and upwardly from respective opposite ends of the pressing portion;
        at least one connecting portion, each connecting portion extending upwardly from one of distal ends of the first and second spring arms; and
        at least one latching portion depending from the at least one connecting portion, each latching portion forming a spring portion, each spring portion being V-shaped and defining a screw hole therein whereby a height of the corresponding latching portion is adjustable; and
    at least one bolt, each bolt being inserted into the screw hole of the corresponding latching portion, each bolt comprising a head and a post depending from the head.

13. The clip as described in claim 12, wherein each spring portion extends outwardly from a central section of the corresponding latching portion.

14. The clip as described in claim 12, wherein each post forms a screw thread on an outer surface thereof engaging with the corresponding spring portion in the screw hole thereof.

15. The clip as described in claim 12, wherein each head defines a cross-slot in a top surface thereof, for facilitating operation of the bolt.

16. A heat dissipation assembly, comprising:
    a CPU;
    a socket supporting the CUP thereon, the socket forming a pair of catches at opposite sides thereon;
    a heat dissipation device mounted on the CPU and comprising a plurality of fins, the heat dissipation device defining a receiving channel therein; and
    a clip adapted to securely attaching said heat dissipation device to said socket with said CPU located therebetween, including a pressing portion with first and second spring arms extending from opposite ends thereof and each formed with first and second latches corresponding to said catches, wherein said second spring arm is provided with a bellow portion adapted to be manipulated by an actuating device such that a length of said second spring arm is reduced thereby tightly pressing said heat dissipation device to said CPU.

* * * * *